(12) United States Patent
Watanabe et al.

(10) Patent No.: US 9,890,471 B2
(45) Date of Patent: Feb. 13, 2018

(54) METHOD FOR PRODUCING GALLIUM NITRIDE CRYSTAL BY REACTING METAL GALLIUM AND IRON NITRIDE

(71) Applicant: DEXERIALS CORPORATION, Tokyo (JP)

(72) Inventors: Makoto Watanabe, Tokyo (JP); Shinya Akiyama, Tokyo (JP); Tatsuya Matsumoto, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 79 days.

(21) Appl. No.: 14/916,055

(22) PCT Filed: Sep. 3, 2014

(86) PCT No.: PCT/JP2014/073234
§ 371 (c)(1),
(2) Date: Mar. 2, 2016

(87) PCT Pub. No.: WO2015/033975
PCT Pub. Date: Mar. 12, 2015

(65) Prior Publication Data
US 2016/0201215 A1    Jul. 14, 2016

(30) Foreign Application Priority Data

Sep. 9, 2013    (JP) .................................. 2013-186789

(51) Int. Cl.
*C30B 9/10*    (2006.01)
*C30B 19/04*    (2006.01)
(Continued)

(52) U.S. Cl.
CPC .......... *C30B 19/04* (2013.01); *C01B 21/0632* (2013.01); *C30B 9/00* (2013.01);
(Continued)

(58) Field of Classification Search
CPC .... C30B 9/00; C30B 9/04; C30B 9/06; C30B 9/08; C30B 9/10; C30B 19/00;
(Continued)

(56) References Cited

U.S. PATENT DOCUMENTS

2006/0037529 A1*  2/2006  D'Evelyn .............. B82Y 10/00
                                              117/36
2009/0087688 A1*  4/2009  Masaki .............. G11B 5/70626
                                              428/842.6
2012/0017825 A1    1/2012  D'Evelyn et al.

FOREIGN PATENT DOCUMENTS

JP    2002-201100 A    7/2002
JP    2005-206415 A    7/2002
JP    2009-051721 A    3/2009

OTHER PUBLICATIONS

Masato Aoki, et.al, 'Influence of 3d-Transition-Metal Addictives on Single Crystal Growth of GaN by the Na Flux Method'. Published by IPOSCIENCE on Sep. 1, 2003 vol. 42, PART1, No. 9A.

* cited by examiner

*Primary Examiner* — Kenneth A Bratland Jr.
(74) *Attorney, Agent, or Firm* — Paratus Law Group, PLLC

(57) ABSTRACT

[Object] To provide a production method capable of producing a gallium nitride crystal at a lower pressure.
[Solution] Provided is a method for producing a gallium nitride crystal, the method including a step of heating metal gallium and iron nitride in a nitrogen atmosphere at least to a reaction temperature at which the metal gallium and the iron nitride react.

13 Claims, 15 Drawing Sheets

(51) Int. Cl.
    *C30B 9/00*         (2006.01)
    *C30B 9/06*         (2006.01)
    *C30B 29/40*       (2006.01)
    *C01B 21/06*       (2006.01)
    *C30B 17/00*       (2006.01)
    *H01L 21/02*       (2006.01)

(52) U.S. Cl.
    CPC ................ *C30B 9/06* (2013.01); *C30B 17/00* (2013.01); *C30B 29/406* (2013.01); *H01L 21/0242* (2013.01); *H01L 21/0254* (2013.01); *H01L 21/02628* (2013.01); *C01P 2002/72* (2013.01); *C01P 2004/03* (2013.01); *C01P 2004/61* (2013.01)

(58) Field of Classification Search
    CPC ......... C30B 19/02; C30B 19/04; C30B 19/10; C30B 19/106; C30B 17/00; C30B 29/00; C30B 29/10; C30B 29/40; C30B 29/403; C30B 29/406; C01B 21/0632; H01L 21/0242; H01L 21/0254; H01L 21/02628; C01P 2002/72; C01P 2004/03; C01P 2004/61
    USPC ......... 117/11, 54, 64–65, 67, 73, 76–79, 81, 117/937, 952
    See application file for complete search history.

FIG. 6
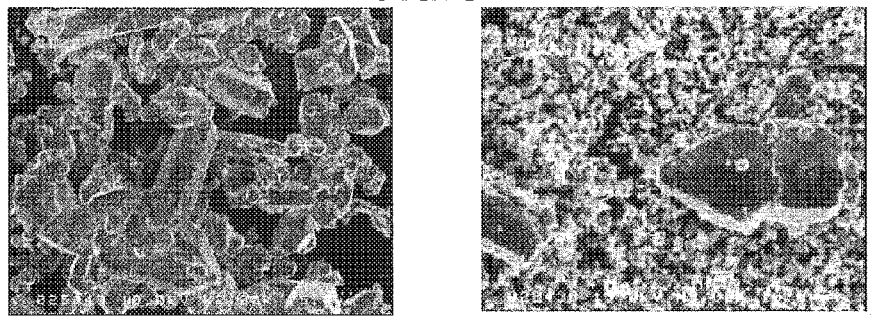
SAMPLE 1 : $Fe_4N$ = 0.2mol%  SAMPLE 2 : $Fe_4N$ = 1mol%
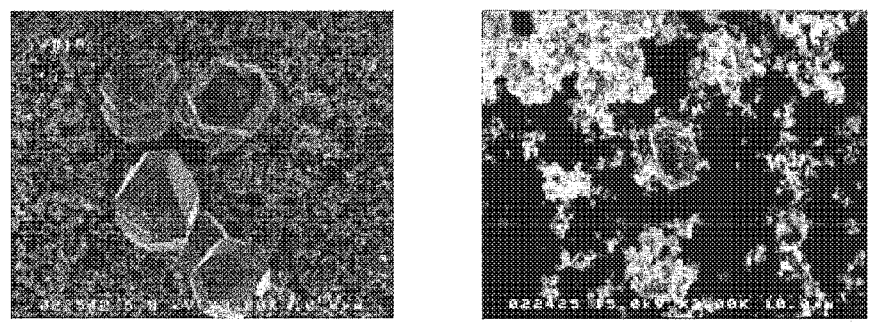
SAMPLE 3 : $Fe_4N$ = 3mol%  SAMPLE 4 : $Fe_4N$ = 5mol%
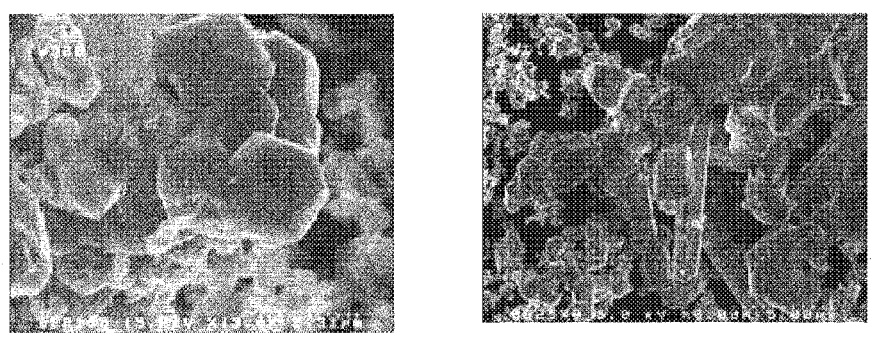
SAMPLE 5 : $Fe_4N$ = 10mol%  SAMPLE 6 : $Fe_4N$ = 20mol%

SAMPLE : Fe$_3$N = 1mol%

METHOD FOR PRODUCING GALLIUM NITRIDE CRYSTAL BY REACTING METAL GALLIUM AND IRON NITRIDE

TECHNICAL FIELD

The present invention relates to a method for producing a gallium nitride crystal.

BACKGROUND ART

These days, gallium nitride (GaN) is drawing attention as a semiconductor material that forms a blue light emitting diode, a semiconductor laser, a high voltage, high frequency power source IC, etc.

At present, gallium nitride used as a semiconductor material is produced as a single-crystal wafer of approximately 2 to 4 inches by vapor phase growth methods such as hydride vapor phase epitaxy (HYPE) and metal organic chemical vapor deposition (MOCVD). However, in the gallium nitride produced by such vapor phase growth, there are a large number of crystal defects, and it is therefore difficult to obtain the characteristics of the objective when it is incorporated in a device. Hence, reducing the amount of crystal defects has been a great issue in the production of gallium nitride crystals.

As a method for reducing the amount of crystal defects, there is a method in which a gallium nitride crystal is grown in a liquid phase, for example. However, in this method, it is necessary to dissolve nitrogen gas in a gallium molten liquid at a high temperature of 1500° C. or more and a very high pressure of 10,000 atmospheres or more in order to grow a gallium nitride crystal; hence, reaction equipment that withstands high temperature and high pressure conditions is needed, and industrial applications have yet to be achieved.

To ease the high temperature and high pressure conditions mentioned above, a method for synthesizing a gallium nitride crystal using an alkali metal as a flux is under study, for example. In particular, a Na flux method using metal sodium is well known. The Na flux method is a method in which metal sodium and metal gallium are mixed and heating is performed at a temperature of approximately 800° C. under nitrogen pressurization at approximately 50 atmospheres or more to synthesize gallium nitride (Patent Literature 1). There is also proposed a method in which gallium oxide and lithium nitride are reacted in a liquid gallium bath at approximately 700° C. under nitrogen pressurization at 40 atmospheres to synthesize gallium nitride (Patent Literature 2).

CITATION LIST

Patent Literature

Patent Literature 1: JP 2002-201100A
Patent Literature 2: JP 2009-51721A

SUMMARY OF INVENTION

Technical Problem

However, even in these methods for producing gallium nitride, reaction under high pressure conditions of approximately 50 atmospheres or more is needed. In such a case, the reaction apparatus is increased in size in order to withstand the high temperature and high pressure conditions, and the stirring of the molten liquid in the high-pressure closed vessel is difficult; hence, industrialization has been hindered.

Thus, an object of the present invention is to produce a gallium nitride crystal under a lower pressure than in the conventional flux method in a method for producing a gallium nitride crystal by liquid phase growth.

Solution to Problem

The present inventors have found that a gallium nitride crystal can be synthesized under a lower pressure by reacting metal gallium and iron nitride and utilizing the nitriding action of the iron nitride, and have completed the present invention.

That is, according to the present invention, there is provided a method for producing a gallium nitride crystal, the method including a step of heating metal gallium and iron nitride in a nitrogen atmosphere at least to a reaction temperature at which the metal gallium and the iron nitride react.

Advantageous Effects of Invention

According to the present invention, a gallium nitride crystal can be produced by liquid phase growth under a lower pressure than in the conventional flux method. Therefore, according to the present invention, as compared to the conventional flux method that has needed a high pressure of approximately 50 atmospheres or more, an expensive high pressure vessel is not needed and gallium nitride can be produced at low cost with simple production equipment. Furthermore, in the present invention, since a crystal is grown in a liquid phase, the amount of crystal defects in the obtained gallium nitride crystal is expected to be reduced as compared to vapor phase crystal growth methods such as CVD.

BRIEF DESCRIPTION OF DRAWING(S)

FIG. 6 is a diagram showing the results of observation using a scanning electron microscope (SEM) of gallium nitride crystals obtained by Example 1.

DESCRIPTION OF EMBODIMENT(S)

Hereinafter, (a) preferred embodiment(s) of the present invention will be described in detail with reference to the appended drawings. In this specification and the drawings, elements that have substantially the same function and structure are denoted with the same reference signs, and repeated explanation is omitted.

1. First Embodiment

First, a method for producing a gallium nitride crystal according to a first embodiment of the present invention is described with reference to FIG. 1 and FIG. 2.

Figure 1:
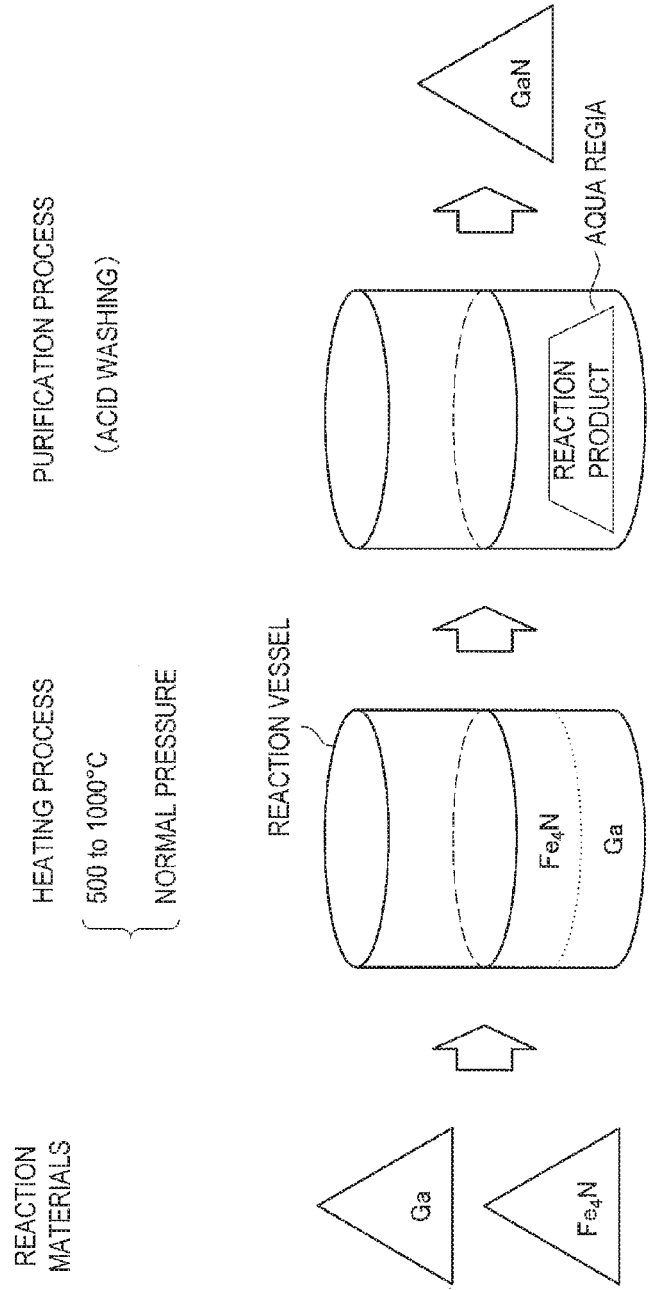
FIG. 1 is an illustration diagram showing an example of the method for producing a gallium nitride crystal according to a first embodiment of the present invention.
Figure 2:
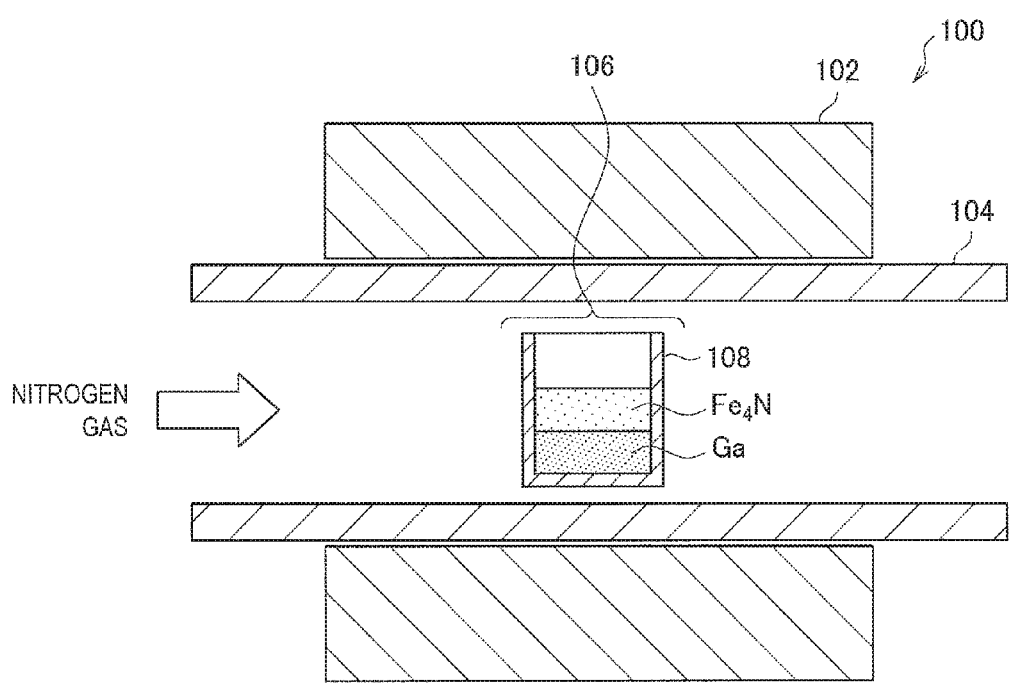
FIG. 2 is a schematic diagram showing an example of the reaction apparatus according to the first embodiment.

FIG. 1 is an illustration diagram describing an example of the method for producing a gallium nitride crystal according to the embodiment, and FIG. 2 is a schematic diagram showing an example of the reaction apparatus used in the production method according to the embodiment.

As shown in FIG. 1, a method for producing gallium nitride according to the embodiment includes a process of heating metal gallium (Ga) and iron nitride (e.g. $Fe_4N$) that are the reaction materials in a reaction vessel and a process of purifying the reaction product after the heating process by acid washing.

Specifically, the heating process is a process in which metal gallium and iron nitride are heated at a temperature of equal to or more than 500° C. and equal to or less than 1000° C. in a nitrogen atmosphere of normal pressure. The purification process is a process in which the reaction product produced by the heating process is acid-washed with aqua regia to purify the gallium nitride. In the following, such a method for producing gallium nitride according to the embodiment is described in detail, including the reaction apparatus used.

(1.1 Reaction Apparatus)

As shown in FIG. 2, a reaction apparatus 100 includes a tubular furnace 104 in an electric furnace 102, and a central portion in the longitudinal direction of the tubular furnace 104 forms a burning zone 106. A reaction vessel 108 with heat resistance formed of boron nitride or the like is housed in the tubular furnace 104 (e.g. the burning zone 106).

The reaction vessel 108 is preferably formed of a material that does not react with metal gallium. In particular, in order not to mix an impurity such as oxygen into the reaction materials, the reaction vessel 108 is preferably formed of boron nitride.

A gas supply means (not illustrated) that supplies the atmosphere gas into the tubular furnace 104 is connected to the tubular furnace 104. The reaction apparatus 100 may not have a special pressure-resistant structure, and may be capable of being used under normal pressure. Therefore, the reaction apparatus 100 can be easily increased in size industrially.

(1.2. Reaction Materials)

In the embodiment, metal gallium and iron nitride are used as the reaction materials.

As the iron nitride, for example, tetrairon mononitride ($Fe_4N$), triiron mononitride ($Fe_3N$), or diiron mononitride ($Fe_2N$), or a mixture of two or more of them may be used.

The metal gallium and the iron nitride are preferably highly pure. For example, as the metal gallium, commercially available ones with a purity of approximately 99.99% or more may be used. As the iron nitride, commercially available ones with a purity of approximately 99.9% or more may be used.

Here, in the heating process described later, the iron atom in the iron nitride serves as a catalyst, and causes active nitrogen to be produced from nitrogen atoms in the iron nitride or nitrogen molecules dissolved in the molten liquid. The produced active nitrogen reacts with the metal gallium; thereby, a gallium nitride crystal can be grown in a liquid phase at a lower pressure than in the conventional flux method. Thus, in the embodiment, since the iron element in the iron nitride serves as a catalyst, the concentration of the iron nitride in the reaction materials is not particularly limited. It is sufficient for the iron nitride to be at least contained in the reaction materials.

However, the mixing ratio between the metal gallium and the iron nitride is preferably a ratio in which the proportion of the number of moles of the iron element in the iron nitride to the total number of moles of the metal gallium and the iron element of the iron nitride is equal to or more than 0.1% and equal to or less than 50%. If the proportion of the iron element is less than 0.1%, the amount of the iron element, which is a catalyst, is small, and the rate of growth of the gallium nitride crystal is slow; thus, this is not preferable. If the proportion of the iron element is more than 50%, gallium oxide etc. may be produced other than gallium nitride, and the crystal growth of gallium nitride may be inhibited; thus, this is not preferable.

For example, in the case where tetrairon mononitride is used as the iron nitride, the ratio of the number of moles between the metal gallium and the tetrairon mononitride may be set to approximately 99.97:0.03 to 80:20 in order to satisfy the proportion of the number of moles of the iron element in the iron nitride mentioned above.

In the case where triiron mononitride or diiron mononitride is used as the iron nitride, the ratio of the number of moles described above may be converted in accordance with the proportion of the iron element and the nitrogen element in the iron nitride. For example, in the case where triiron mononitride is used as the iron nitride, the ratio of the number of moles between the metal gallium and the triiron mononitride may be set to approximately 99.96:0.04 to 75:25. In the case where diiron mononitride is used as the iron nitride, the ratio of the number of moles between the metal gallium and the diiron mononitride may be set to approximately 99.94:0.06 to 67.5:32.5.

(1.3 Heating Process)

In the heating process, metal gallium and iron nitride are put into the reaction vessel 108 of the reaction apparatus 100 described above, and the reaction vessel 108 is housed in the burning zone 106 in the tubular furnace 104. Subsequently, nitrogen gas is introduced into the tubular furnace 104, and the metal gallium and the iron nitride put in the reaction vessel 108 are heated in the electric furnace 102 under normal pressure, for example.

The metal gallium and the iron nitride in the reaction vessel 108 are heated at least to a reaction temperature at which the metal gallium and the iron nitride react. The reaction temperature of the metal gallium and the iron nitride is specifically equal to or more than 500° C. and equal to or less than 1000° C., and preferably equal to or more than 600° C. and equal to or less than 1000° C.

The metal gallium and the iron nitride in the reaction vessel 108 are, after reaching the reaction temperature, kept at a temperature in the range of reaction temperature described above through a prescribed time. Hereinafter, the temperature at which the metal gallium and the iron nitride in the reaction vessel 108 are kept after temperature increase may be referred to as a keeping temperature.

The time through which the metal gallium and the iron nitride are kept at the keeping temperature may be set as appropriate in accordance with the keeping temperature. For example, when the keeping temperature is in a range of equal to or more than 500° C. and equal to or less than 1000° C., the keeping time is preferably set to 1 hour or more. The keeping temperature at which the metal gallium and the iron nitride are kept may be constant or may vary during the keeping time to the extent that the keeping temperature is within the range of reaction temperature of the metal gallium and the iron nitride (e.g. equal to or more than 500° C. and equal to or less than 1000° C.).

For example, the keeping temperature at which the metal gallium and the iron nitride are kept may increase or decrease during the keeping time. However, to improve the quality of the gallium nitride crystal, it is preferable to avoid a rapid temperature change. For example, the amount of change in the keeping temperature at which the metal gallium and the iron nitride are kept may be less than 6° C. per hour.

By the heating process, the iron atom of the iron nitride serves as a catalyst, and active nitrogen is produced from nitrogen atoms in the iron nitride or nitrogen molecules that are dissolved in the molten liquid from in the atmosphere; thus, gallium nitride is produced. For example, in the case where tetrairon mononitride is used as the iron nitride, it is presumed that the reaction of the following formula occurs with the nitrogen atom of the iron nitride.

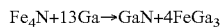
$$Fe_4N + 13Ga \rightarrow GaN + 4FeGa_3$$

It is presumed that the reaction of the following formula occurs with the nitrogen molecule that is dissolved in the molten liquid from in the nitrogen atmosphere.

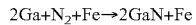
$$2Ga + N_2 + Fe \rightarrow 2GaN + Fe$$

In the heating process, since gallium nitride can be produced at a relatively low temperature of 1000° C. or less, the gallium nitride once synthesized does not decompose. Therefore, by the embodiment, a gallium nitride crystal can be produced in good yield.

There is a case where gallium oxide is produced in the heating process, due to oxygen contained in a small amount in the iron nitride or the atmosphere gas. Such gallium oxide is isolated from the gallium nitride in the purification process described below.

(1.4. Purification Process)

In the reaction product obtained in the heating process mentioned above, usually not only gallium nitride but also gallium oxide, an intermetallic compound of iron and gallium, etc. are contained. Hence, the gallium nitride crystal is isolated and purified by the purification process.

As the purification process, acid washing using an acid such as aqua regia may be used. Thereby, the gallium oxide, the intermetallic compound of iron and gallium, etc. can be dissolved and the gallium nitride crystal can be isolated and purified.

Thus, by the embodiment, a gallium nitride crystal can be obtained safely in good yield by liquid phase growth reaction at a low temperature of 1000° C. or less in a nitrogen atmosphere of a lower pressure (e.g. normal pressure) than in the conventional flux method.

2. Second Embodiment

Next, a method for producing a gallium nitride crystal according to a second embodiment of the present invention is described with reference to FIG. 3A and FIG. 3B.

A method for producing a gallium nitride crystal according to the second embodiment is a method in which a crystal growth substrate serving as a crystal growth nucleus is immersed in a source material molten liquid in which metal gallium and iron nitride are melted, and thereby a gallium nitride crystal film is produced on the crystal growth substrate. By the embodiment, the crystal growth orientation of the produced gallium nitride crystal film can be made consistent with the crystal orientation of the crystal growth substrate (that is, a gallium nitride crystal film is epitaxially grown), and therefore a gallium nitride crystal suitable for the fabrication of a semiconductor functional element can be produced.

The production method according to the second embodiment differs from the production method according to the first embodiment only in the reaction apparatus used; and the reaction materials used, the heating process, and the purification process are almost the same, and a description herein is omitted. In the second embodiment, the purification process may be performed, or may be omitted.

(2.1. Reaction Apparatus)

First, a reaction apparatus used in the method for producing a gallium nitride crystal according to the embodiment is described. FIG. 3A is a schematic diagram showing an example of the reaction apparatus used in the method for producing a gallium nitride crystal according to the embodiment.

Figure 3A:
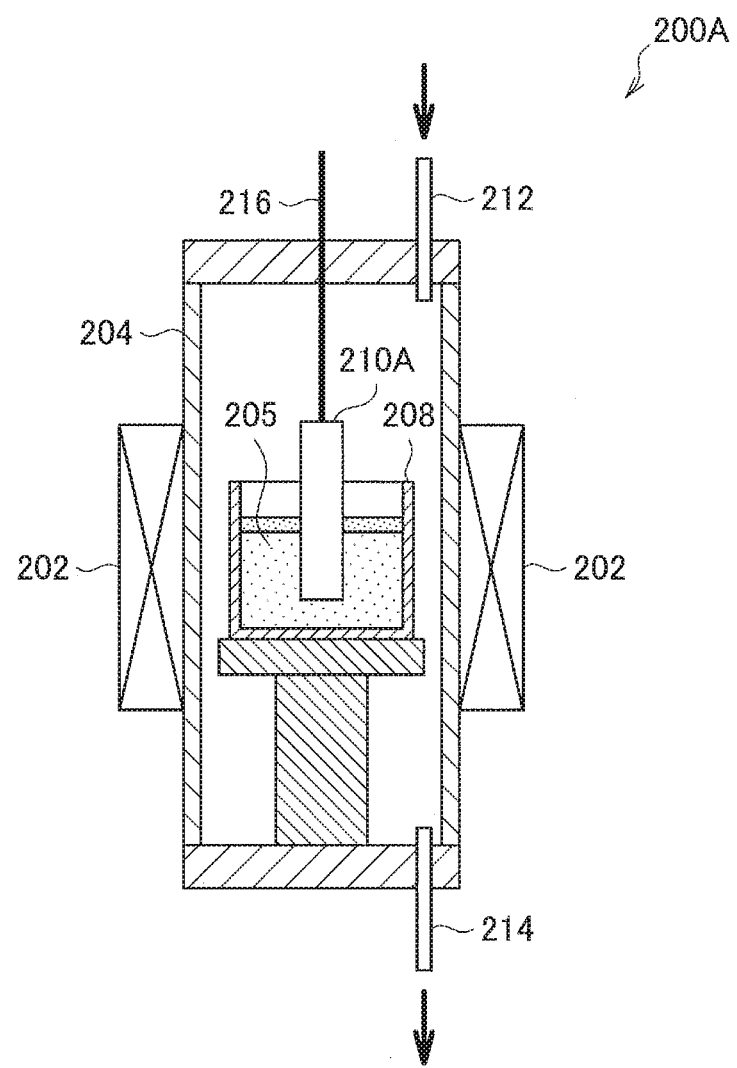
FIG. 3A is a schematic diagram showing an example of the reaction apparatus according to a second embodiment of the present invention.

As shown in FIG. 3A, a reaction apparatus 200A includes an electric furnace 204, a heater 202 provided in the electric furnace 204, a gas introduction port 212, a gas exhaust port 214, and a rotating shaft 216. A reaction vessel 208 in which a molten liquid 205 containing metal gallium and iron nitride is put is placed still in the electric furnace 204. Here, a crystal growth substrate 210A in a strip shape is attached to the tip of the rotating shaft 216.

The electric furnace 204 has a sealed structure, and houses the reaction vessel 208 therein. The electric furnace 204 may have, for example, a tubular structure with an inner diameter of approximately 200 mm and a height of approximately 800 mm. The heater 202 is disposed at substantially the center in the longitudinal direction of the electric furnace 204, and heats the interior of the electric furnace 204.

The gas introduction port 212 introduces the atmosphere gas into the electric furnace 204. The gas exhaust port 214 exhausts the atmosphere gas from the interior of the electric furnace 204. The interior of the electric furnace 204 is kept at almost normal pressure by the gas introduction port 212 and the gas exhaust port 214.

The rotating shaft 216 is provided in an upper portion of the electric furnace 204, and the crystal growth substrate 210A in a strip shape is attached to the tip of the rotating shaft 216. In the embodiment, the crystal growth substrate 210A can be immersed in the molten liquid 205 by raising and lowering the rotating shaft 216; thus, a gallium nitride crystal film can be deposited on the crystal growth substrate 210A.

The rotating shaft 216 is provided rotatably on its axis, and can rotate the crystal growth substrate 210A immersed in the molten liquid 205, with the rotating shaft 216 as the axial center. Since rotating the crystal growth substrate 210A causes the molten liquid 205 to be stirred, the nitrogen concentration distribution in the molten liquid 205 can be made more uniform. Hence, in order to deposit a gallium nitride crystal film more uniformly, it is preferable to rotate the crystal growth substrate 210A in the molten liquid 205 using the rotating shaft 216.

(2.2. Modification Example of the Reaction Apparatus)

Next, a modification example of the reaction apparatus used in the method for producing a gallium nitride crystal according to the embodiment is described with reference to FIG. 3B. FIG. 3B is a schematic diagram showing a modification example of the reaction apparatus used in the method for producing a gallium nitride crystal according to the embodiment. A reaction apparatus 200B shown in FIG. 3B differs from the reaction apparatus 200A shown in FIG. 3A in that a crystal growth substrate 210B can be attached to the tip of the rotating shaft 216 horizontally to the surface of the molten liquid.

Figure 3B:
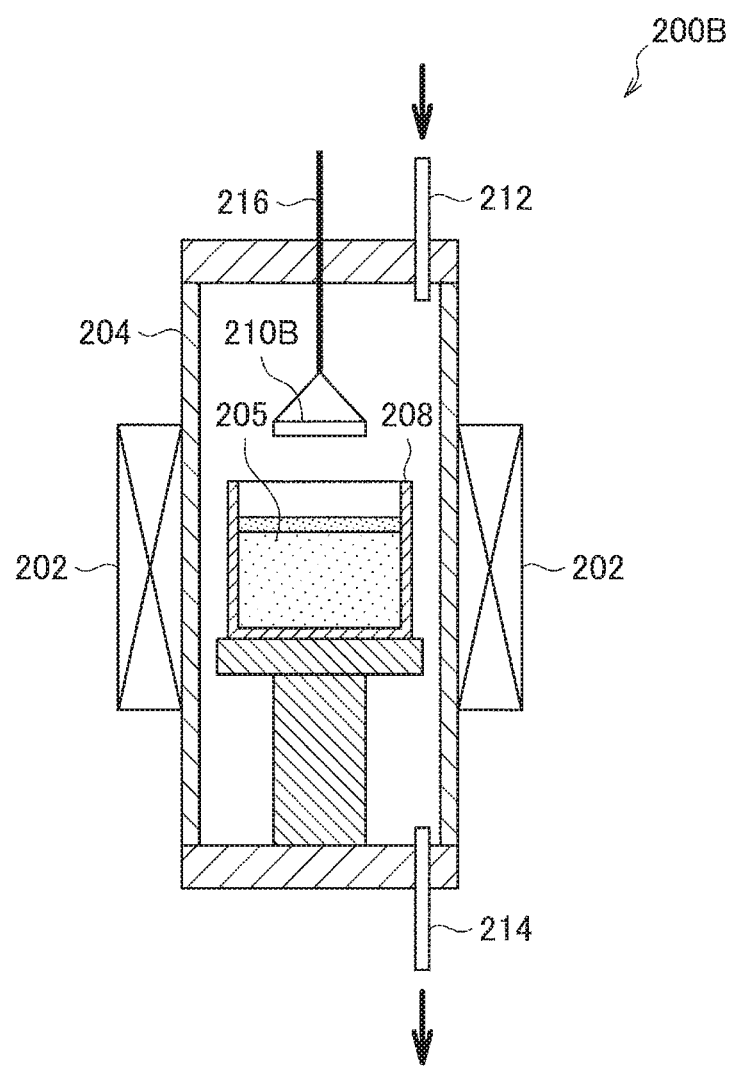
FIG. 3B is a schematic diagram showing a modification example of the reaction apparatus according to the second embodiment.

As shown in FIG. 3B, the reaction apparatus 200B includes the electric furnace 204, the heater 202 provided in the electric furnace 204, the gas introduction port 212, the gas exhaust port 214, and the rotating shaft 216. The reaction vessel 208 in which the molten liquid 205 containing metal gallium and iron nitride is put is placed still in the electric furnace 204. Here, the crystal growth substrate 210B is attached to the tip of the rotating shaft 216 horizontally.

The heater 202, the electric furnace 204, the molten liquid 205, the reaction vessel 208, the gas introduction port 212, the gas exhaust port 214, and the rotating shaft 216 are as described in FIG. 3A, and a description herein is omitted.

The rotating shaft 216 includes, at its tip, a plurality of hooks for sandwiching the crystal growth substrate 210B, for example, and the crystal growth substrate 210B can be attached horizontally to the liquid surface of the molten liquid 205. Thereby, the crystal growth substrate 210B is not influenced by the nitrogen concentration distribution in the depth direction of the molten liquid 205; thus, a gallium nitride crystal film can be grown more uniformly.

Here, when the molten liquid 205 is heated, since the nitrogen solubility in the molten liquid 205 decreases with the temperature increase, there has been a case where nitrogen ions in the molten liquid 205 are reduced into nitrogen gas and the molten liquid 205 makes foaming.

The molten liquid 205 in which nitrogen gas is produced and foaming has occurred rises in a foamy way, and the position of the liquid surface becomes indistinct. Hence, when the crystal growth substrate 210B attached horizontally in the above manner is immersed in the molten liquid 205, foaming due to nitrogen gas has been undesirable because it becomes difficult to check whether the crystal growth substrate 210B is immersed in the molten liquid 205 or not. Furthermore, the temperature of the molten liquid 205 varies greatly with the amount of foaming due to nitrogen gas. Hence, foaming due to nitrogen gas has been undesirable because the temperature of the molten liquid 205 may change rapidly.

Although the foaming of nitrogen gas from the molten liquid 205 disappears with the lapse of time, the molten liquid 205 needs to be kept while being heated through several hours to a dozen or so hours during the disappearance of the foaming. Hence, foaming due to nitrogen gas has been undesirable because the production costs are increased by the generation of waiting time until the foaming disappears.

The present inventors have found that the occurrence of nitrogen gas can be suppressed and the rising of the liquid surface of the molten liquid 205 can be suppressed by controlling the concentration of nitrogen atoms contained in the molten liquid 205 and the heating temperature of the molten liquid 205. Specifically, it has been found that the occurrence of nitrogen gas from the molten liquid 205 can be suppressed by reducing the proportion of the iron nitride out of the metal gallium and the iron nitride that are the starting materials, or reducing the reaction temperature at which the metal gallium and the iron nitride are reacted.

More specifically, when the reaction temperature at which the metal gallium and the iron nitride are reacted is denoted by T [° C.], the proportion X [%] of the number of moles of the iron element in the iron nitride to the total number of moles of the metal gallium and the iron element in the iron nitride preferably satisfies Mathematical Formula 1 below. In such a case, the occurrence of nitrogen gas from in the molten liquid 205 is suppressed, and therefore the rising of the liquid surface of the molten liquid 205 can be suppressed.

$$X \leq -1.44 \times 10^{-2} \times T + 14.4 \qquad \text{Mathematical Formula 1}$$

In the case where the iron nitride is tetrairon mononitride, when the reaction temperature at which the metal gallium and the tetrairon mononitride are reacted is denoted by T [° C.] and the proportion of the number of moles of the tetrairon mononitride to the total number of moles of the metal gallium and the tetrairon mononitride is denoted by x [%], Mathematical Formula 1 above can be expressed by Mathematical Formula 2 below.

$$x \leq -3.75 \times 10^{-3} \times T + 3.75 \qquad \text{Mathematical Formula 2}$$

Under the conditions expressed by Mathematical Formula 1 or Mathematical Formula 2 above, since the occurrence of nitrogen gas from the molten liquid 205 is suppressed and the liquid surface of the molten liquid 205 does not rise due to foaming, the immersion of the crystal growth substrate 210B in the molten liquid 205 becomes easier; thus, this is more preferable. Furthermore, since foaming at the liquid surface is suppressed, the temperature of the molten liquid 205 does not change rapidly; thus, this is more preferable.

As described hereinabove, by the embodiment, a gallium nitride crystal film can be produced on a crystal growth substrate in a nitrogen atmosphere of a lower pressure (e.g. normal pressure) than in the conventional flux method. The produced gallium nitride crystal film can be suitably used for the fabrication of a semiconductor functional element.

EXAMPLES

3. Examples

The present invention will now be described more specifically using Examples.

(3.1. Example 1: Production of Gallium Nitride Crystals Using Tetrairon Mononitride)

First, Example 1 in which the production method according to the first embodiment is used to produce gallium nitride crystals using metal gallium and tetrairon mononitride as the starting materials is described.

A crucible made of boron nitride in a circular cylindrical shape with an inner diameter of approximately 30 mm and a depth of approximately 35 mm was prepared as the heat-resistant reaction vessel 108 of the reaction apparatus 100 shown in FIG. 2.

Metal gallium (purity: 99.99999%; 5N Plus Inc.) and tetrairon mononitride ($Fe_4N$) (purity: 99.9%; Kojundo Chemical Lab. Co., Ltd.) were put into the crucible with the mixing proportions of Table 1, and the crucible was placed in the tubular furnace (cross-sectional area: approximately 180 $cm^2$) 104 of the reaction apparatus 100. In Table 1, the proportion of the number of moles of the iron element in the tetrairon mononitride to the total number of moles of the iron element in the tetrairon mononitride and the metal gallium is shown as "Fe/(Fe+Ga)".

TABLE 1

| Sample No. | Metal gallium (mol %) | Tetrairon mononitride (mol %) | Fe/(Fe + Ga) (%) |
|---|---|---|---|
| 1 | 99.8 | 0.2 | 0.8 |
| 2 | 99 | 1 | 3.8 |
| 3 | 97 | 3 | 11 |
| 4 | 95 | 5 | 17.3 |
| 5 | 90 | 10 | 30.8 |
| 6 | 80 | 20 | 50 |

Figure 4:
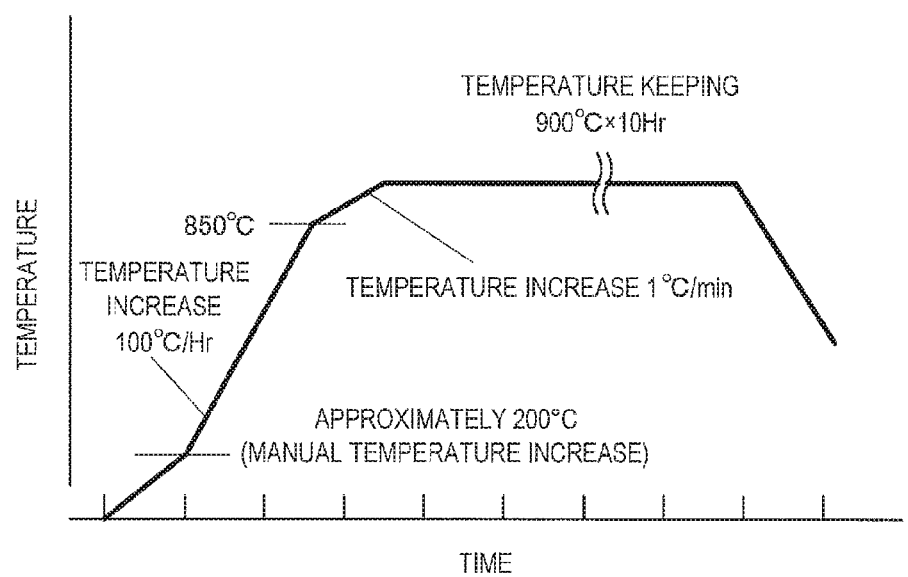
FIG. 4 is a graph showing a temperature profile during heating in Example 1.

Nitrogen gas was introduced into the tubular furnace 104 at a flow rate of approximately 3000 mL per minute, and the atmosphere in the tubular furnace 104 was made substantially 100% nitrogen. Next, while the nitrogen atmosphere in the tubular furnace 104 was maintained, the temperature in the tubular furnace 104 was increased to 900° C. with the temperature profile shown in FIG. 4, and was kept at 900° C. for 10 hours. FIG. 4 is a graph showing a temperature increase profile of the production method according to Example 1.

Figure 5:
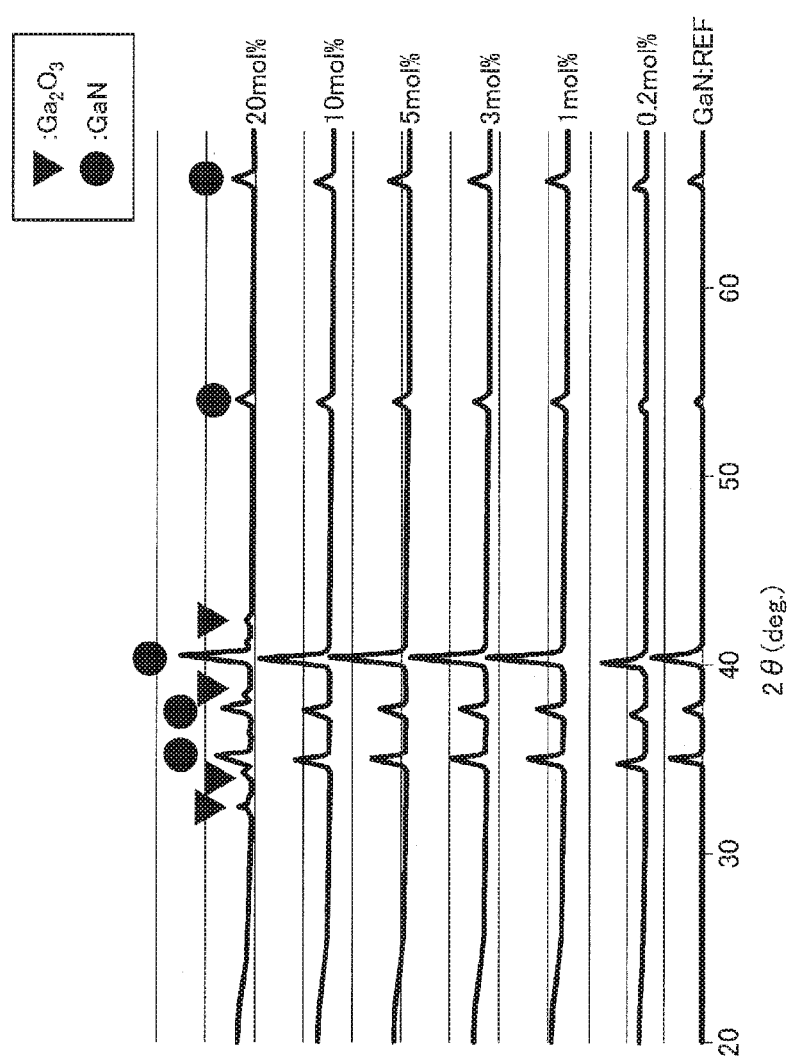
FIG. 5 is a graph showing the results of X-ray diffraction (XRD) analysis of gallium nitride crystals obtained by Example 1.

After that, the interior of the tubular furnace 104 was naturally cooled to room temperature using 10 hours, and the residual material components in the crucible (namely, metal gallium, tetrairon mononitride, and an intermetallic compound of gallium and iron) were removed by aqua regia to isolate the reaction product. For the isolated reaction product, X-ray diffraction analysis was performed using an X-ray diffraction (XRD) apparatus (RINT 2500, Rigaku Corporation) to check whether a gallium nitride crystal had been produced or not. A polycrystalline gallium nitride powder (Aldrich Corporation) was used as the control sample. The results are shown in FIG. 5. FIG. 5 is a graph showing XRD spectra of the gallium nitride crystals produced by the production method according to Example 1.

As shown in FIG. 5, in all of samples 1 to 6, similar peaks to the polycrystalline gallium nitride powder that is the control sample were seen, and it has been found that a gallium nitride crystal has been produced in the Example. In sample 6 (tetrairon mononitride: 20 mol %), also small peaks of gallium oxide ($Ga_2O_3$) were detected. This is presumed to be because gallium oxide ($Ga_2O_3$), which is an oxide, was produced during the heating reaction due to a small amount of oxygen contained in the tetrairon mononitride used as a source material and the peaks of the gallium oxide were detected.

The gallium nitride crystal obtained from each sample of Example was observed with a scanning electron microscope (SEM) (S-4500, Hitachi High-Technologies Corporation) to obtain a SEM image. The results are shown in FIG. 6. FIG. 6 is images showing the results of SEM observation of the gallium nitride crystals produced by the production method according to Example 1.

As shown in FIG. 6, it is found that the obtained gallium nitride crystal has a size of a diameter of approximately 10 μm and has a hexagonal columnar or hexagonal plate-like shape. The hexagonal columnar or hexagonal plate-like shape is presumed to be derived from the crystal structure of the hexagonal crystal of the gallium nitride. Thus, from the results of Example 1, it has been found that a gallium nitride crystal can be produced by the production method according to the embodiment. Even in the case where the mixing proportion of the tetrairon mononitride is less than 0.2 mol %, a gallium nitride crystal is expected to be similarly produced as long as tetrairon mononitride is contained.

(3.2. Example 2: Production of Gallium Nitride Crystals Using Triiron Mononitride)

Next, Example 2 in which the production method according to the first embodiment is used to produce gallium nitride crystals using metal gallium and triiron mononitride as the starting materials is described.

Gallium nitride crystals were produced similarly to Example 1 except that triiron mononitride (purity: 99.9%; Kojundo Chemical Lab. Co., Ltd.) was used in place of the tetrairon mononitride used in Example 1 with the mixing proportions of Table 2.

TABLE 2

| Sample No. | Metal gallium (mol %) | Triiron mononitride (mol %) |
|---|---|---|
| 1 | 99 | 1 |
| 2 | 95 | 5 |

Figure 7:
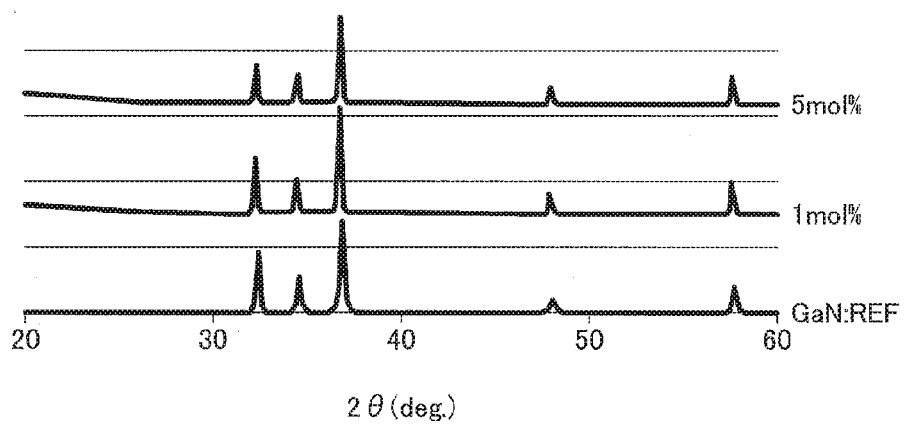
FIG. 7 is a graph showing XRD spectra of gallium nitride crystals obtained by Example 2.
Figure 8:
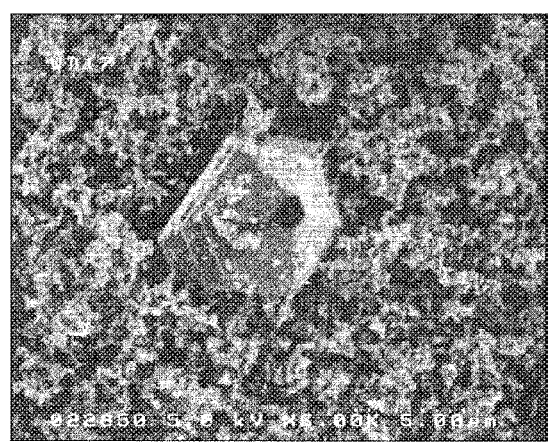
FIG. 8 is an image showing the result of SEM observation of a gallium nitride crystal obtained by Example 2.

The produced gallium nitride crystals were subjected to XRD analysis similarly to Example 1. The results are shown in FIG. 7. Further, similarly to Example 1, the gallium nitride crystal produced using sample 1 was observed with a SEM to obtain a SEM image. The result is shown in FIG. 8. FIG. 7 is a graph showing XRD spectra of the gallium nitride crystals obtained by Example 2, and FIG. 8 is an image showing the result of SEM observation of the gallium nitride crystal obtained by Example 2.

As shown in FIG. 7, in samples 1 and 2, similar peaks to the gallium nitride powder that is the control sample were seen, and it has been found that a gallium nitride crystal has been produced also in Example 2. As shown in FIG. 8, it has been found that the obtained gallium nitride crystal has a hexagonal columnar shape.

Thus, from the results of Example 2, it has been found that a gallium nitride crystal can be produced similarly to Example 1 also in the case where triiron mononitride is used as the iron nitride.

(3.3. Example 3: Thermogravimetric Analysis of Metal Gallium and Iron Nitride)

Next, Example 3 in which thermogravimetric analysis was performed on a mixture of metal gallium and tetrairon mononitride in order to investigate the reaction temperature of the metal gallium and the iron nitride is described.

Figure 9:
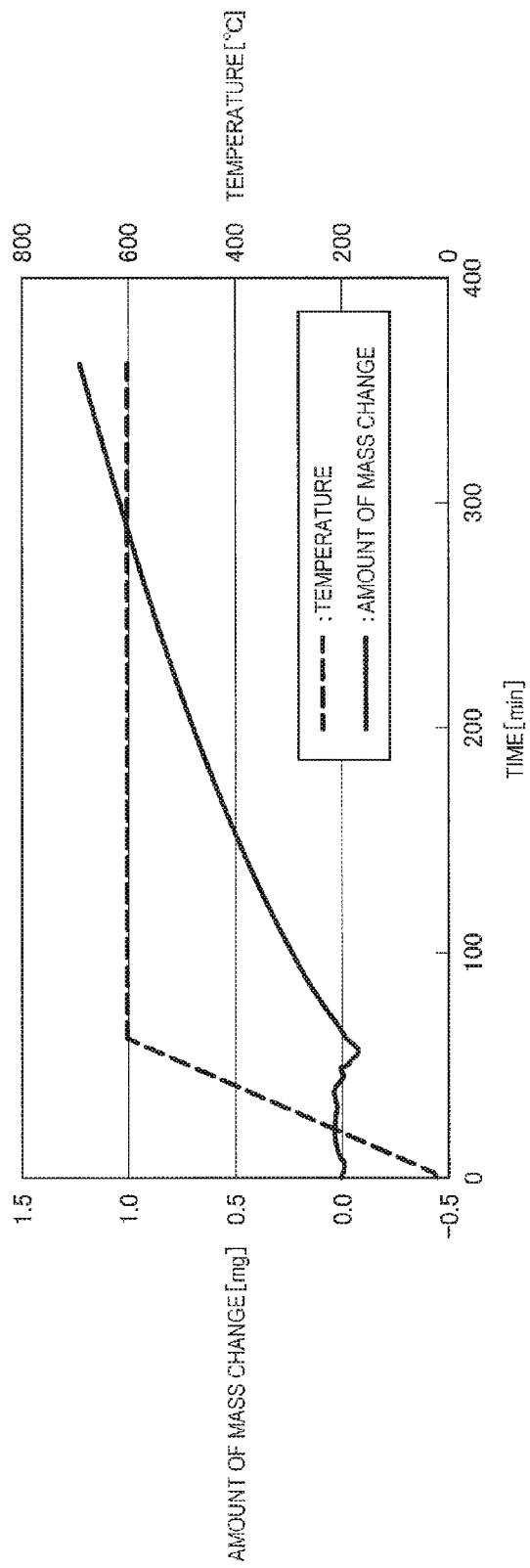
FIG. 9 is a graph showing the result of thermogravimetric analysis of metal gallium and iron nitride in the case where the metal gallium and the iron nitride are kept at a constant temperature.

First, 49.1 mg of metal gallium and 3.5 mg of tetrairon mononitride (Fe4N=2 mol %) were mixed and heated in a reaction vessel of which the interior had been made a nitrogen atmosphere by introducing nitrogen gas at 200 ml/min, and were kept at a prescribed keeping temperature for 5 hours. The change in mass of the metal gallium and the tetrairon mononitride in this case was observed with a thermogravimetric analysis apparatus. As the metal gallium and the tetrairon mononitride, similar ones to those used in Example 1 were used; and 54 mg of aluminum oxide (Al2O3) was used as the reference sample of the thermogravimetric analysis apparatus. The result is shown in FIG. 9. FIG. 9 is a graph showing the result of thermogravimetric analysis of the metal gallium and the iron nitride in the case of being kept at a constant temperature.

In FIG. 9, the horizontal axis represents the time that has elapsed from the starting of heating. The amount of mass change from the total mass of the metal gallium and the tetrairon mononitride at the time of starting heating is shown by the solid line, and the graduations are written on the vertical axis on the left side. The temperature of the metal gallium and the tetrairon mononitride is shown by the broken line, and the graduations are written on the vertical axis on the right side. FIG. 9 is the result when the keeping temperature is set to 600° C.

As shown in FIG. 9, it is found that, after the temperature of the metal gallium and the tetrairon mononitride has reached the keeping temperature of 600° C., the total mass of the mixture of the metal gallium and the tetrairon mononitride increases gradually. This is presumed to be because nitrogen in the atmosphere was taken into the molten liquid of the metal gallium and the tetrairon mononitride. Since the total mass of the mixture of the metal gallium and the tetrairon mononitride does not saturate immediately, it is presumed that the absorbed nitrogen reacts with the metal gallium and is deposited as a gallium nitride crystal, and the nitrogen concentration in the molten liquid does not saturate and nitrogen is continuously absorbed into the molten liquid.

Figure 10:
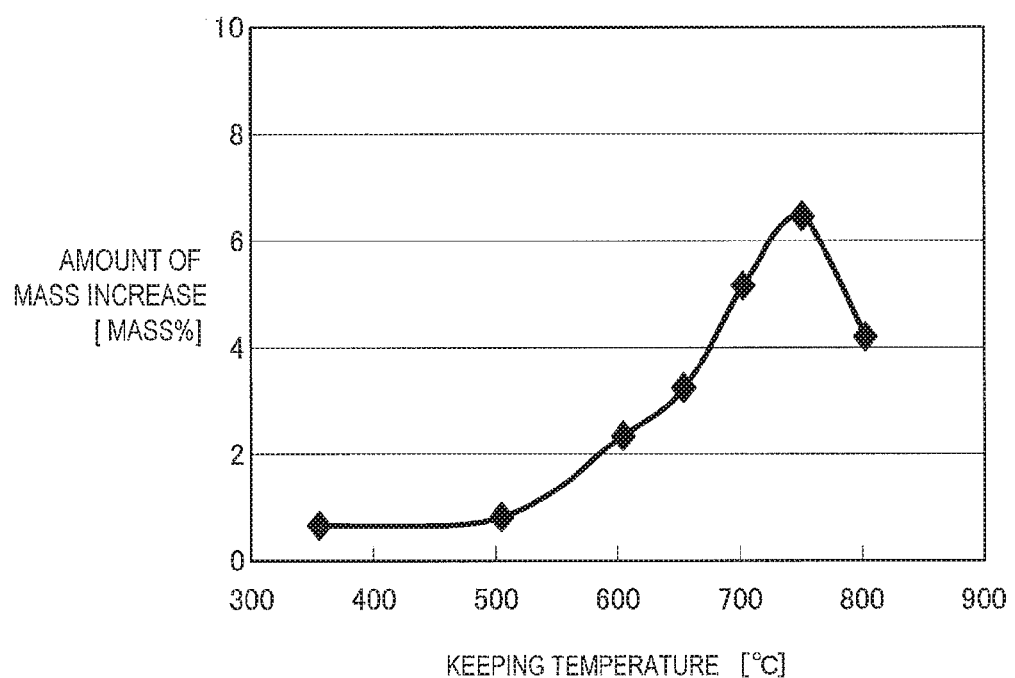
FIG. 10 is a graph showing the amount of mass increase with respect to the reaction temperature of metal gallium and iron nitride.

Next, the keeping temperature was changed in a range of 350° C. to 800° C. to perform the thermogravimetric analysis of the metal gallium and the tetrairon mononitride described above. In FIG. 10, the results of conversion in which the amount of mass increase of the molten liquid of the metal gallium and the tetrairon mononitride after the lapse of 5 hours is converted to the proportion to the total mass before heating are shown. FIG. 10 is a graph showing the amount of mass increase with respect to the reaction temperature of the metal gallium and the iron nitride.

As shown in FIG. 10, it is found that the amount of mass increase of the molten liquid of the metal gallium and the tetrairon mononitride after being kept for 5 hours increases when the keeping temperature is 500° C. or more, and the amount of mass increase of the molten liquid increases more rapidly when the keeping temperature is 600° C. or more. This is presumed to be because, when the keeping temperature is 500° C. or more, the absorption of nitrogen in the atmosphere into the molten liquid like that shown in FIG. 9 has occurred and a gallium nitride crystal is deposited; and when the keeping temperature is 600° C. or more, a gallium nitride crystal is deposited more rapidly. That is, it is found that the metal gallium and the tetrairon mononitride react at temperatures of 500° C. or more, and react more vigorously at temperatures of 600° C. or more; and produce a gallium nitride crystal while absorbing nitrogen in the atmosphere.

From the results of Examples 1 to 3, it is found that the reaction temperature of the metal gallium and the iron nitride is preferably equal to or more than 500° C., at which the production of gallium nitride starts, and more preferably equal to or more than 600° C. When the reaction temperature of the metal gallium and the iron nitride is more than approximately 1000° C., a mass decrease that is presumably due to the vaporization of metal gallium from the molten liquid occurs; therefore, the reaction temperature of the metal gallium and the iron nitride is preferably 1000° C. or less. Thus, the reaction temperature of the metal gallium and the iron nitride is preferably equal to or more than 500° C. and equal to or less than 1000° C., and more preferably equal to or more than 600° C. and equal to or less than 1000° C.

(3.4. Example 4: Production of a Gallium Nitride Crystal Film on a Strip-Shaped Substrate)

Next, Example 4 in which the production method according to the second embodiment is used to produce a gallium nitride crystal film on a crystal growth substrate in a strip shape using metal gallium and tetrairon mononitride as the starting materials is described.

Specifically, a gallium nitride crystal film was produced on a strip-shaped substrate using the reaction apparatus 200A shown in FIG. 3A. First, a crucible made of boron nitride in a circular cylindrical shape with an inner diameter of approximately 60 mm, a depth of approximately 60 mm, and a thickness of approximately 2 mm was prepared as the heat-resistant reaction vessel 208 of the reaction apparatus 200A shown in FIG. 3A.

Metal gallium (purity: 99.99999%; 5N Plus Inc.) and tetrairon mononitride ($Fe_4N$) (purity: 99.9%; Kojundo Chemical Lab. Co., Ltd.) were put into the crucible with the proportion of Ga:$Fe_4N$=99.8 mol %:0.2 mol % up to approximately half depth of the crucible. The crucible was placed in the electric furnace 204 (the inner diameter of the interior of the furnace: approximately 200 mm; the height of the interior of the furnace: approximately 800 mm) of the reaction apparatus 200A; and a strip-shaped (002)-plane sapphire substrate with a width of approximately 5 mm, a length of approximately 50 mm, and a thickness of approximately 0.4 mm was attached to the tip of the rotating shaft 216, and was immersed in the molten liquid 205. A substrate commercially available as a substrate for CVD growth of gallium nitride (KYOCERA Corporation) was used as the (002)-plane sapphire substrate.

Figure 11:
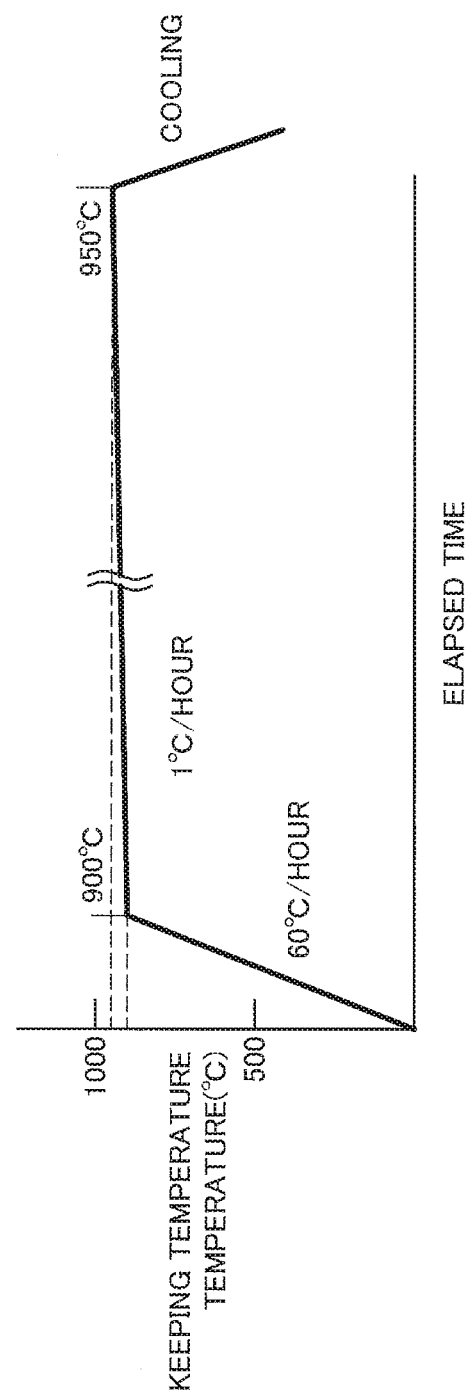
FIG. 11 is a graph showing a temperature increase profile during heating in Example 4.

Nitrogen gas was introduced into the electric furnace 204 via the gas introduction port 212 at a flow rate of approximately 3000 mL per minute, and the interior of the electric furnace 204 was made a nitrogen atmosphere of substantially 100% nitrogen. Next, while the nitrogen atmosphere in the electric furnace 204 was maintained, the temperature in the electric furnace 204 was controlled with the temperature profile shown in FIG. 11. FIG. 11 is a graph showing a temperature increase profile during heating in Example 4.

As shown in FIG. 11, first, the temperature in the electric furnace 204 was increased to approximately 900° C. at a rate of 60° C. per hour. Next, after the temperature in the electric furnace 204 had reached approximately 900° C., the temperature was gently increased at a rate of approximately 1° C. per hour, and the temperature was increased to approximately 950° C. using approximately 50 hours. While the temperature was increased from approximately 900° C. to approximately 950° C., the sapphire substrate was rotated by the rotating shaft 216 at a rate of 10 revolutions per minute, with the rotating shaft 216 as the axial center, so that a uniform gallium nitride crystal film was deposited.

Figure 12A:
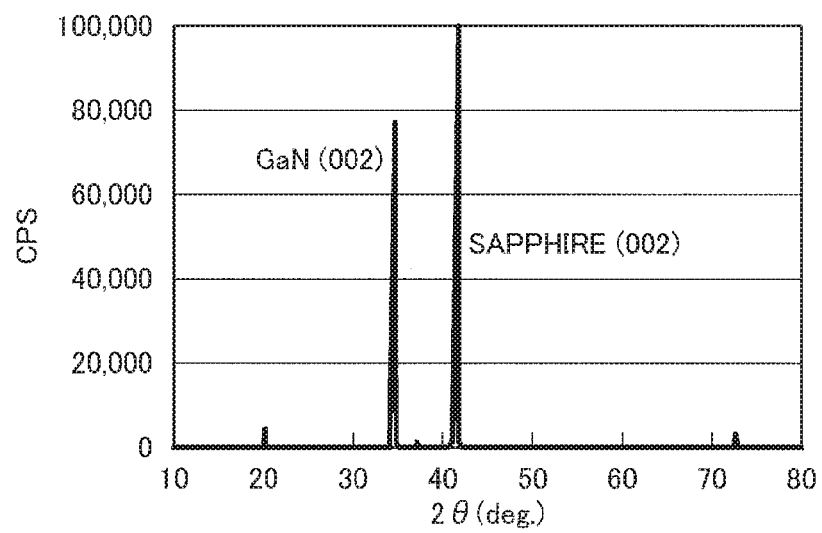
FIG. 12A is a graph showing an XRD spectrum of a gallium nitride crystal film produced at a temperature increase of 1° C. per hour.

After the temperature had reached 950° C., the sapphire substrate was pulled up from the molten liquid 205, the heating by the heater 202 of the electric furnace 204 was stopped, and natural cooling was performed by natural heat dissipation until the molten liquid 205 returned to room temperature. The sapphire substrate taken out was subjected to XRD analysis similarly to Example 1. The result is shown in FIG. 12A. FIG. 12A is a graph showing an XRD spectrum of the gallium nitride crystal film produced at a temperature increase of 1° C. per hour.

Figure 12B:
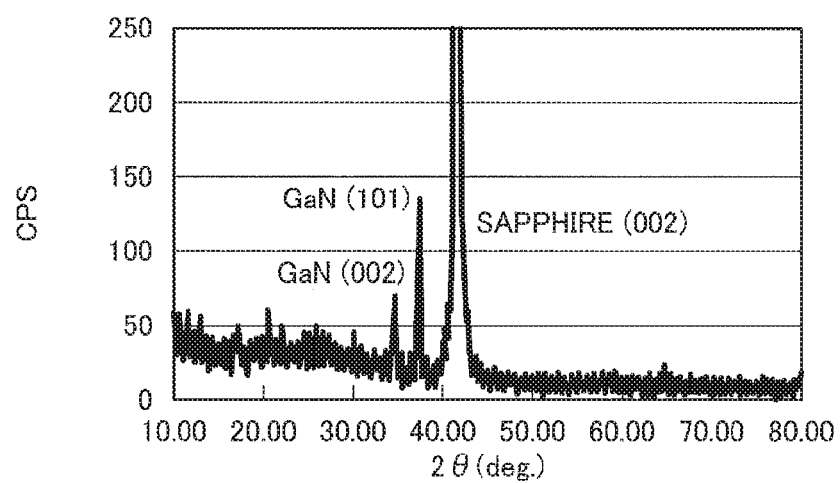
FIG. 12B is a graph showing an XRD spectrum of a gallium nitride crystal film produced at a temperature increase of 6° C. per hour.

Also the XRD analysis of a gallium nitride crystal film produced on a sapphire substrate in the same manner as above except that the rate of temperature increase after reaching approximately 900° C. was set to approximately 6° C. per hour and the temperature of the molten liquid 205 was increased to approximately 950° C. using approximately 8 hours was performed. The result is shown in FIG. 12B. FIG. 12B is a graph showing an XRD spectrum of the gallium nitride crystal film produced at a temperature increase of 6° C. per hour.

As shown in FIG. 12A and FIG. 12B, in both the XRD analyses, in addition to a characteristic peak of $2\theta=40°$ derived from the (002) plane of the sapphire substrate that is the crystal growth substrate, a characteristic peak of $2\theta=34.5°$ derived from the (002) plane of the gallium nitride was observed. Thus, it is found that a gallium nitride crystal film can be produced by the method for producing a gallium nitride crystal according to Example 4.

The characteristic peak of the (002) plane was observed more strongly in the gallium nitride crystal produced at a temperature increase of 1° C. per hour (FIG. 12A). On the other hand, in the gallium nitride crystal produced at a temperature increase of 6° C. per hour (FIG. 12B), in addition to the characteristic peak of the (002) plane of the gallium nitride, also a characteristic peak of the (101) plane of the gallium nitride was observed.

From the results, it is found that the gallium nitride crystal film produced at a temperature increase of 1° C. per hour has a crystal growth orientation consistent with the crystal orientation of the crystal growth substrate (that is, grows epitaxially), and has become a gallium nitride crystal film oriented in the C-axis.

Therefore, it is found that, in order to produce a gallium nitride crystal film oriented in the C-axis by epitaxial growth, it is preferable not to make a rapid temperature change when the metal gallium and the iron nitride are kept at the keeping temperature for a prescribed time. This is presumed to be because, if the rate of temperature increase of the metal gallium and the iron nitride is too large, the gallium nitride crystal grows also in directions unrelated to the crystal orientation of the crystal growth substrate that is the underlayer, and becomes a crystal film with disordered orientation.

Thus, in order to produce a gallium nitride crystal film with a higher orientation, it is preferable that the temperature change be made gentler or the temperature be kept constant in the time of being kept at the keeping temperature for a prescribed time. For example, the rate of change in the keeping temperature at which the metal gallium and the iron nitride are kept may be in a range of less than 6° C. per hour.

In Example 4, a gallium nitride crystal film was produced using a temperature profile in which the temperature was gradually increased after reaching the reaction temperature (approximately 900° C.) as shown in FIG. 11; but it is presumed that a gallium nitride crystal film can be produced also using the temperature profile shown in FIG. 4 as a matter of course. That is, a gallium nitride crystal film can be similarly produced also using a temperature profile in which the temperature is kept constant after reaching the reaction temperature (approximately 900° C.) as shown in FIG. 4.

(3.5. Example 5: Production of a Gallium Nitride Crystal Film on a Flat-Plate Substrate)

Next, Example 5 in which the production method according to the second embodiment is used to produce a gallium nitride crystal film on a crystal growth substrate in a flat plate shape using metal gallium and tetrairon mononitride as the starting materials is described.

Specifically, a gallium nitride crystal film was produced on a substrate in a flat plate shape using the reaction apparatus 200B shown in FIG. 3B in place of the reaction apparatus 200A used in Example 4. That is, the production method according to Example 5 differs from Example 4 only in that the crystal growth substrate on which a gallium nitride crystal film is to be deposited is not in a strip shape but in a shape of a flat plate that is attached horizontally to the liquid surface of the molten liquid 205. The temperature in the electric furnace 204 was controlled in accordance with the temperature profile shown in FIG. 11.

Figure 13:
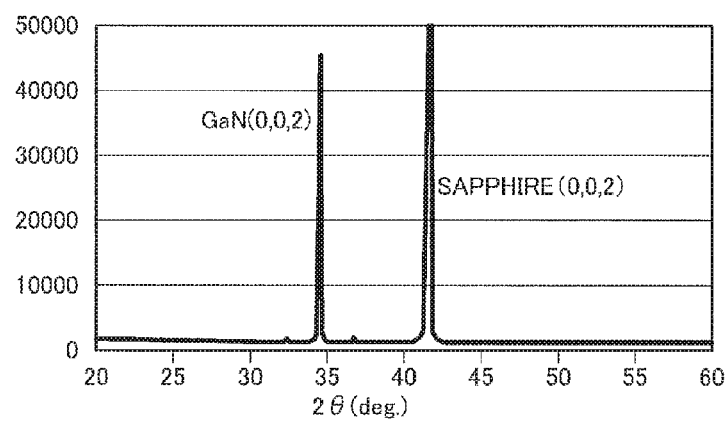
FIG. 13 is a graph showing an XRD spectrum of a gallium nitride crystal film obtained by Example 5.

The gallium nitride crystal film produced by the reaction apparatus 200B mentioned above was subjected to XRD similarly to Example 1. The result is shown in FIG. 13. FIG. 13 is a graph showing an XRD spectrum of the gallium nitride crystal film obtained by Example 5.

As shown in FIG. 13, in addition to a characteristic peak of $2\theta=40°$ derived from the (002) plane of the sapphire substrate that is the crystal growth substrate, a strong characteristic peak of $2\theta=34.5°$ derived from the (002) plane of the gallium nitride was observed. Thus, it is found that a gallium nitride crystal film that has a crystal growth orientation consistent with the crystal orientation of the crystal growth substrate (that is, grows epitaxially) and is oriented in the C-axis can be produced by the production method according to Example 5.

Therefore, from the result of Example 5, it is found that the method for producing a gallium nitride crystal according to the embodiment can produce a gallium nitride crystal film that has grown epitaxially, without limitation of the method for immersing the sapphire substrate that is the crystal growth substrate.

(3.6. Example 6: Production of a Gallium Nitride Crystal Film in which Foaming is Suppressed)

Next, Example 6 in which the rising of the liquid surface of the molten liquid 205 due to nitrogen gas produced during the heating of the metal gallium and the iron nitride was investigated is described.

Specifically, metal gallium and tetrairon mononitride were put into a crucible with prescribed proportions, and the crucible was placed in the electric furnace 204 of the reaction apparatus 200B shown in FIG. 3B and heating was performed. Nitrogen gas was introduced into the electric furnace 204 via the gas introduction port 212 at a flow rate of approximately 300 mL per minute, and the interior of the electric furnace 204 was made a nitrogen atmosphere of substantially 100% nitrogen. As the metal gallium and the tetrairon mononitride, similar ones to those used in Example 1 were used.

Figure 14:
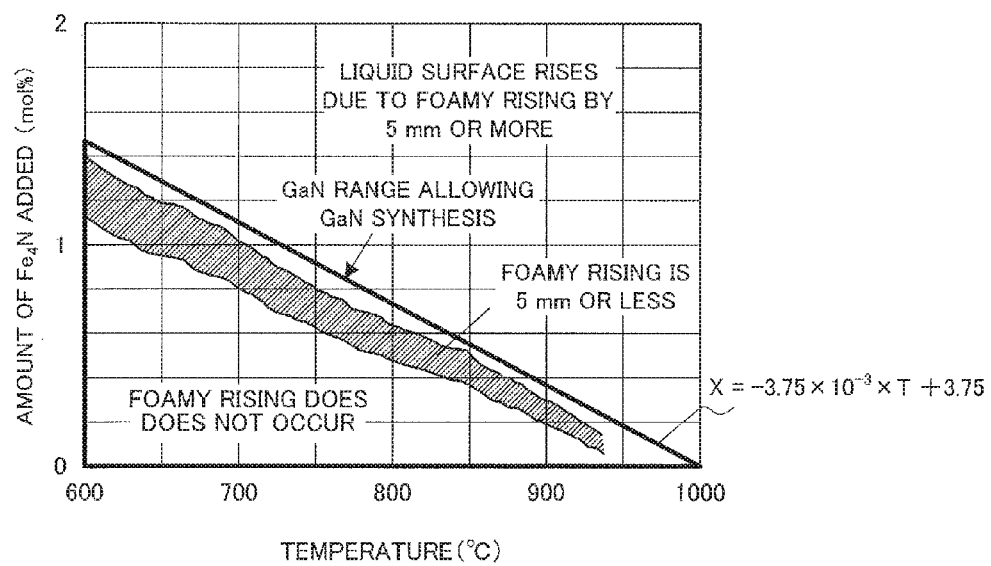
FIG. 14 is a graph in which the presence or absence of the rising of the liquid surface of the molten liquid is plotted against the amount of tetrairon mononitride added and the heating temperature.

Here, the proportion of the number of moles of the tetrairon mononitride to the total number of moles of the metal gallium and the tetrairon mononitride was changed from 0.2 mol % to 2 mol % by 0.2 mol % at a time, and the heating temperature of the metal gallium and the tetrairon mononitride was changed from approximately 600° C. to 1000° C. by approximately 50° C. at a time; and the presence or absence of the rising of the liquid surface due to foaming under each condition was observed. The results are shown in FIG. 14. FIG. 14 is a graph in which the presence or absence of the rising of the liquid surface is plotted against the amount of tetrairon mononitride added and the heating temperature.

As shown in FIG. 14, it is found that the rising of the liquid surface of the molten liquid 205 due to the occurrence of nitrogen gas is less likely to occur when the amount of tetrairon mononitride added is smaller and the heating temperature is lower. This is presumed to be because, as the heating temperature increases, the nitrogen solubility of the molten liquid 205 decreases, and consequently nitrogen atoms that have failed to exist dissolved become nitrogen gas and make foaming.

Referring to FIG. 14, when the reaction temperature at which the metal gallium and the tetrairon mononitride are reacted is denoted by T [° C.] and the proportion of the number of moles of the tetrairon mononitride to the total number of moles of the metal gallium and the tetrairon mononitride is denoted by x [%], it is found that the region where the rising of the liquid surface of the molten liquid 205 due to nitrogen gas does not occur is the region formed by connecting the three points of (x, T)=(1.5, 600), (0, 1000), and (0, 600). That is, it is found that the conditions where the rising of the liquid surface of the molten liquid 205 due to nitrogen gas does not occur can be expressed by Mathematical Formula 3 below.

$$x \leq -3.75 \times 10^{-3} \times T + 3.75 \qquad \text{Mathematical Formula 3}$$

When x in Mathematical Formula 3 is generalized by being converted to the proportion X [%] of the number of moles of the iron element in the iron nitride to the total number of moles of the metal gallium and the iron element in the iron nitride, Mathematical Formula 3 can be expressed by Mathematical Formula 4 below.

$$X \leq -1.44 \times 10^{-2} \times T + 14.4 \qquad \text{Mathematical Formula 4}$$

Under the conditions expressed by Mathematical Formula 3 or Mathematical Formula 4 above, which are calculated experimentally, since the occurrence of nitrogen gas from the molten liquid 205 is suppressed and the liquid surface of the molten liquid 205 does not rise due to foaming, the crystal growth substrate 210B can be easily immersed in the molten liquid 205. Furthermore, under the conditions expressed by Mathematical Formula 3 or Mathematical Formula 4, since foaming at the liquid surface of the molten liquid 205 is suppressed, the possibility of a rapid temperature change of the molten liquid 205 is reduced; thus, a gallium nitride crystal film can be produced more stably.

(3.7. Example 7: Production of a Gallium Nitride Crystal Film when Stirring is Performed)

Next, Example 7 is described that is capable of producing a gallium nitride crystal film uniformly on a plurality of crystal growth substrates by, in the production method according to the second embodiment, using a holder 300 that holds the crystal growth substrates and stirring the molten liquid 205.

Figure 15:
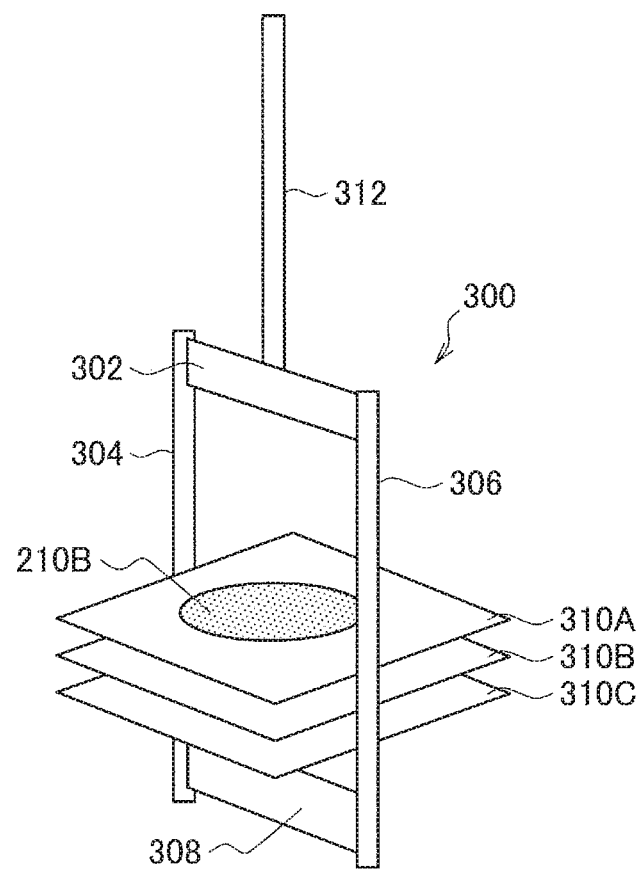
FIG. 15 is a perspective view showing the structure of a holder that holds a crystal growth substrate.
Figure 16:
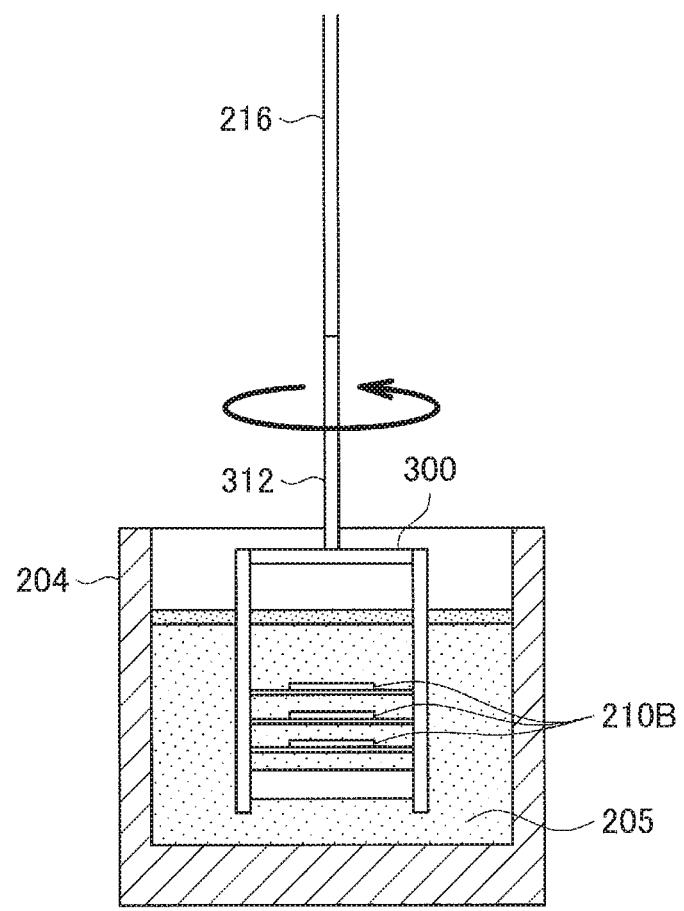
FIG. 16 is an illustration diagram describing a situation where the holder is immersed in the molten liquid.

First, the holder 300 that holds the crystal growth substrate used in Example 7 is described with reference to FIG. 15 and FIG. 16. FIG. 15 is a perspective view showing the structure of the holder 300 that holds the crystal growth substrate 210B. FIG. 16 is an illustration diagram describing a situation where the holder 300 is immersed in the molten liquid 205.

As shown in FIG. 15, the holder 300 has a structure in which both ends of supporting columns 304 and 306 that are two columnar members are connected by beams 302 and 308. In the space formed by the supporting columns 304 and 306 and the beams 302 and 308, a plurality of shelves 310A, 310B, and 310C are disposed to be sandwiched by the supporting columns 304 and 306. Here, the shelves 310A, 310B, and 310C are disposed perpendicularly to the supporting columns 304 and 306, and the crystal growth substrate 210B is held on the shelves 310A, 310B, and 310C (the crystal growth substrates held on the shelves 310B and 310C are not illustrated). A connection shaft 312 for connection to the rotating shaft 216 of the reaction apparatus 200B is formed at the beam 302 on the opposite side to the side where the shelves 310A etc. are formed.

By the holder 300 like this, as shown in FIG. 16, the plurality of crystal growth substrates 210B held by the holder 300 can be immersed in the molten liquid 205 in the reaction vessel 208 at one time. Furthermore, since the connection shaft 312 of the holder 300 is connected to the rotating shaft 216 of the reaction apparatus 200B, the holder 300 can stir the molten liquid 205 by being rotated by the rotating shaft 216. Thus, the molten liquid 205 is stirred by the rotation of the holder 300 and the nitrogen concentration in the molten liquid 205 is made uniform; consequently, a gallium nitride crystal film can be grown more uniformly between a plurality of crystal growth substrates 210B or in the plane of the crystal growth substrate 210B.

Next, a specific method for producing a gallium nitride crystal film according to Example 7 is described. A crucible made of boron nitride in a circular cylindrical shape with an inner diameter of approximately 60 mm, a depth of approximately 60 mm, and a thickness of approximately 2 mm was prepared as the heat-resistant reaction vessel 208 of the reaction apparatus 200B shown in FIG. 3B.

Metal gallium (purity: 99.99999%; 5N Plus Inc.) and tetrairon mononitride ($Fe_4N$) (purity: 99.9%; Kojundo Chemical Lab. Co., Ltd.) were put into the crucible up to approximately half depth of the crucible with the proportion of Ga:$Fe_4$N=99.8 mol %:0.2 mol %. The crucible was placed in the electric furnace 204 (the inner diameter of the interior of the furnace: approximately 200 mm; the height of the interior of the furnace: approximately 800 mm) of the reaction apparatus 200B. The holder 300 shown in FIG. 15 was connected to the rotating shaft 216 in a state where a plurality of (002)-plane sapphire substrates in a disc shape with a diameter of 25 mm (KYOCERA Corporation) were held on the shelves 310A, 310B, 310C, etc.

The spacing between adjacent ones of the shelves 310A, 310B, and 310C was set to approximately 10 mm, and the holder 300 was formed of boron nitride. As the material of the holder 300, materials other than boron nitride may be used to the extent that they do not react with gallium even at high temperatures of approximately 1000° C.; for example, aluminum oxide may be used.

Nitrogen gas was introduced into the electric furnace 204 via the gas introduction port 212 at a flow rate of approximately 3000 mL per minute, and the interior of the electric furnace 204 was made a nitrogen atmosphere of substantially 100% nitrogen. Next, while the nitrogen atmosphere in the electric furnace 204 was maintained, the temperature in the electric furnace 204 was controlled with the temperature profile shown in FIG. 11, similarly to Example 5 etc. While the temperature was approximately 900° C. to approximately 950° C. in the profile, the holder 300 was rotated at a rate of 10 revolutions per minute, with the rotating axis 216 as the axial center.

After the crystal growth finished and cooling was performed to room temperature, the sapphire substrate was taken out; and when the thickness of the grown crystal was measured with a micro level difference meter, the average thickness of the gallium nitride crystal film on the sapphire substrate held on the lowermost shelf 310C was approximately 2.2 μm. The average thickness of the gallium nitride crystal film on the sapphire substrate held on the uppermost shelf 310A was approximately 2.4 μm. Thus, it has been found that, when the holder 300 is used and the molten liquid 205 is stirred by rotation, a gallium nitride crystal film can be grown uniformly on a plurality of sapphire substrates because the nitrogen concentration difference in the depth direction of the molten liquid 205 is reduced.

On the other hand, when a gallium nitride crystal film was grown under the same conditions as above except that the holder 300 was not rotated while the temperature was approximately 900° C. to approximately 950° C., the average thickness of the gallium nitride crystal film on the sapphire substrate held on the lowermost shelf 310C was approximately 1.2 μm. The average thickness of the gallium nitride crystal film on the sapphire substrate held on the uppermost shelf 310A was approximately 1.8 μm. Thus, it has been found that, when the molten liquid 205 is not stirred by rotation, a large variation occurs in the thickness of the grown gallium nitride crystal film between sapphire substrates held on different shelves.

Therefore, from the results of Example 7, it is found that a gallium nitride crystal film can be grown uniformly between a plurality of crystal growth substrates 210B by growing a gallium nitride crystal film while using the holder 300 shown in FIG. 15 and stirring the molten liquid 205.

As described in detail hereinabove, by the method for producing a gallium nitride crystal according to the present invention, a gallium nitride crystal can be produced by liquid phase growth under a lower pressure by using metal gallium and iron nitride. Furthermore, by the method for producing a gallium nitride crystal according to the present invention, a gallium nitride crystal film having a crystal growth orientation consistent with the crystal orientation of a substrate (that is, epitaxially grown) can be produced on the substrate serving as a seed crystal or a crystal growth nucleus.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST

100 reaction apparatus
102 electric furnace
104 tubular furnace
106 burning zone
108 reaction vessel
200A, 200B reaction apparatus
202 heater
204 electric furnace
205 molten liquid
208 reaction vessel
210A, 210B crystal growth substrate
212 gas introduction port
214 gas exhaust port
216 rotating shaft
300 holder

The invention claimed is:

1. A method for producing a gallium nitride crystal, the method comprising:
   heating metal gallium and iron nitride in a nitrogen atmosphere at least to a reaction temperature at which the metal gallium and the iron nitride react,
   wherein a proportion of a number of moles of an iron element in the iron nitride to a total number of moles of the metal gallium and the iron element in the iron nitride is equal to or more than 0.1% and equal to or less than 30.8%.

2. The method for producing a gallium nitride crystal according to claim 1,
   wherein the iron nitride contains at least one of tetrairon mononitride, triiron mononitride, and diiron mononitride.

3. The method for producing a gallium nitride crystal according to claim 1,
   wherein the reaction temperature is equal to or more than 500° C. and equal to or less than 1000° C., and
   wherein the method further comprises keeping the metal gallium and the iron nitride at a temperature in a range of the reaction temperature after the metal gallium and the iron nitride are heated to the reaction temperature.

4. The method for producing a gallium nitride crystal according to claim 1,
   wherein the metal gallium and the iron nitride are heated using a crucible made of boron nitride as a vessel.

5. The method for producing a gallium nitride crystal according to claim 1,
   wherein, when the reaction temperature is denoted by T [° C.], a proportion X [%] of the number of moles of an iron element in the iron nitride to the total number of moles of the metal gallium and the iron element in the iron nitride satisfies Mathematical Formula 1 below:

$$X \leq -1.44 \times 10^{-2} \times T + 14.4 \qquad \text{Mathematical Formula 1.}$$

6. The method for producing a gallium nitride crystal according to claim 1, further comprising:
   increasing a temperature of the metal gallium and the iron nitride above the reaction temperature by between approximately 1° C. and 6° C. per hour after the metal gallium and the iron nitride are heated to the reaction temperature.

7. The method for producing a gallium nitride crystal according to claim 1,
   wherein heating the metal gallium and iron nitride method further comprises increasing a temperature of the metal gallium and the iron nitride by between approximately 60° C. and 100° C. per hour until the metal gallium and the iron nitride are heated to the reaction temperature.

8. The method for producing a gallium nitride crystal according to claim 1,
   wherein the metal gallium and the iron nitride are heated as a molten liquid and at least one crystal growth substrate is immersed in the molten liquid in order to form the gallium nitride crystal on a surface of the at least one crystal growth substrate.

9. The method for producing a gallium nitride crystal according to claim 8,
   wherein the at least one crystal growth substrate is attached to a rotatable shaft horizontal to an upper surface of the molten liquid.

10. The method for producing a gallium nitride crystal according to claim 9,
    wherein the rotatable shaft is rotated while the at least one crystal growth substrate is immersed in the molten liquid.

11. The method for producing a gallium nitride crystal according to claim 8, wherein the at least one crystal growth substrate comprises a plurality of crystal growth substrates attached horizontally parallel to one another.

12. The method for producing a gallium nitride crystal according to claim 8,
wherein the at least one crystal growth substrate comprises at least one sapphire substrate.

13. The method for producing a gallium nitride crystal according to claim 1,
wherein the gallium nitride crystal is formed as a film having an average thickness of between approximately 2.2 μm and 2.4 μm.

* * * * *